United States Patent
Yamada

(10) Patent No.: US 7,599,221 B2
(45) Date of Patent: Oct. 6, 2009

(54) FLOATING GATE MEMORY DEVICE WITH IMPROVED REFERENCE CURRENT GENERATION

(75) Inventor: Junichi Yamada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/055,335

(22) Filed: Mar. 26, 2008

(65) Prior Publication Data

US 2008/0239825 A1  Oct. 2, 2008

(30) Foreign Application Priority Data

Mar. 30, 2007  (JP) .............................. 2007-094282

(51) Int. Cl.
*G11C 11/34* (2006.01)
(52) U.S. Cl. ............................... 365/185.2; 365/185.21
(58) Field of Classification Search ............... 365/185.2, 365/185.21, 185.25
See application file for complete search history.

(56) References Cited

U.S. PATENT DOCUMENTS 5,754,475 A * 5/1998 Bill et al. ............... 365/185.25
6,226,213 B1 * 5/2001 Chih ...................... 365/210.13
6,304,486 B1 * 10/2001 Yano ..................... 365/185.22
7,263,004 B2 * 8/2007 Chen ..................... 365/185.25

FOREIGN PATENT DOCUMENTS

JP  08-190797  7/1996

\* cited by examiner

*Primary Examiner*—Anh Phung
(74) *Attorney, Agent, or Firm*—Young & Thompson

(57) ABSTRACT

A non-volatile semiconductor memory device is provided with: a first memory cell including a floating gate transistor; a first bitline connected to a diffusion layer which is used as a source of the first memory cell; a second bitline connected to a diffusion layer which is used as a drain of the first memory cell; a first reference cell including a floating gate transistor; a third bitline electrically isolated from the first bitline and connected to a diffusion layer which is used as a source of the first reference cell; a read circuit identifying data stored in the first memory cell in response to a memory cell signal received from the first memory cell through the second bitline and a reference signal received from the first reference cell through the fourth bitline; and a bitline level controller controlling a voltage level of the third bitline.

9 Claims, 13 Drawing Sheets

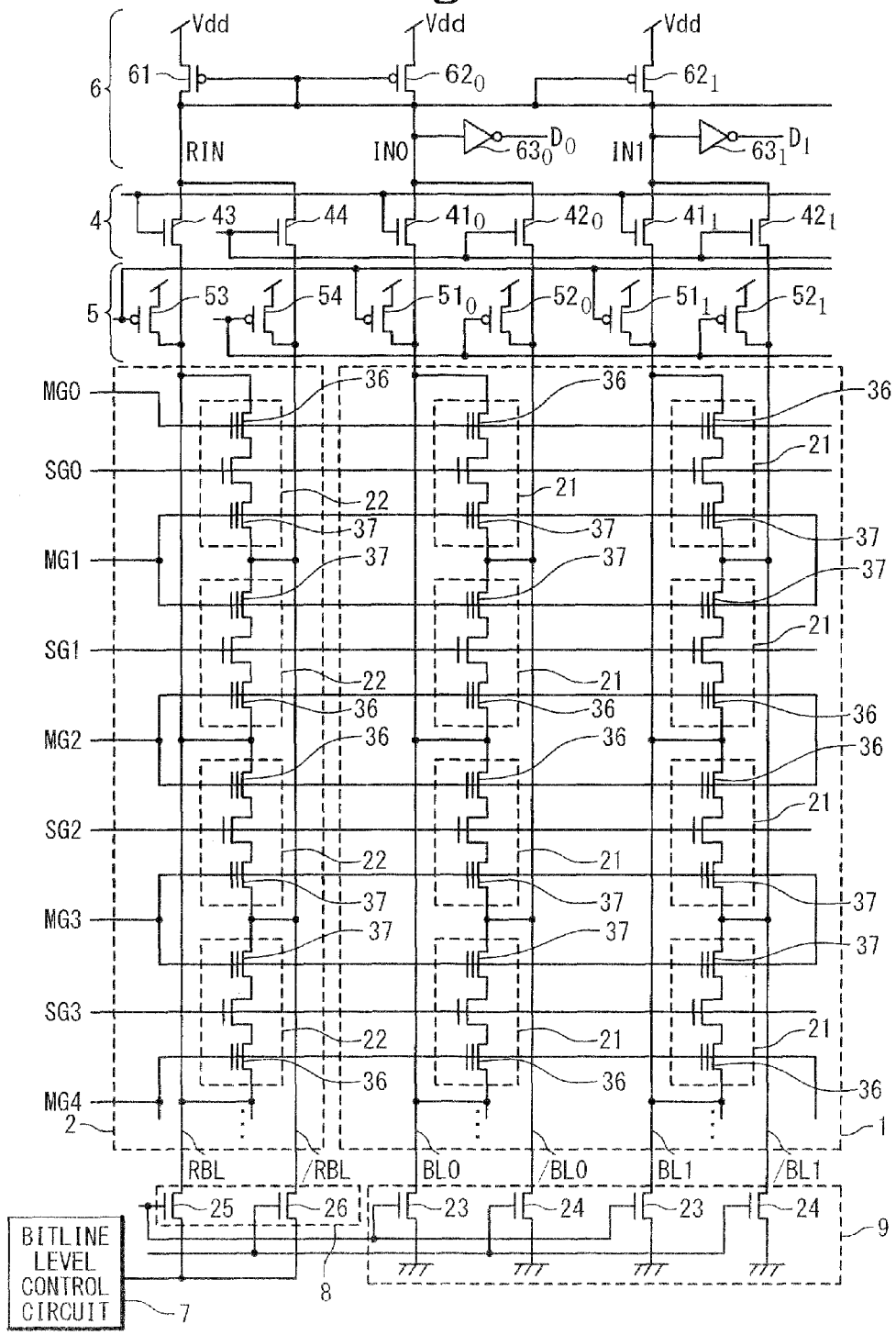

FLOATING GATE MEMORY DEVICE WITH IMPROVED REFERENCE CURRENT GENERATION

This application claims the benefit of priority based on Japanese Patent Application No. 2007-094282, filed on Mar. 30, 2007, the disclosure of which is incorporated herein by reference.

BACKGROUND OF THE INVENTION

1. Field of the Invention

The present invention relates to a non-volatile semiconductor memory device, more particularly, to data read operation in a non-volatile semiconductor memory device designed to store data by charge accumulation on floating gates, such as a flash memory.

2. Description of the Related Art

In general, a non-volatile semiconductor memory device configured to store data by charge accumulation on floating gates of memory cell transistors, such as a flash memory, uses reference cells in data read operations from memory cells. Most typically, reference cells are used to generate a reference current, and data stored in the selected memory cell are identified by comparing the cell current obtained from the memory cell with the reference current. It should be noted that, in this specification, the "floating gate" means to include not only a floating gate formed of conductive material but also that formed of insulating material over which charges are accumulated, such as a MONOS cell (metal-oxide-nitride-oxide-semiconductor cell).

Japanese Laid Open Patent Application No. JP-A Heisei, 8-190797 discloses a non-volatile semiconductor memory device which uses reference cells for data read operations from memory cells. FIG. 1 shows the configuration of the non-volatile semiconductor memory device disclosed in this patent application. The disclosed non-volatile semiconductor memory device is provided with memory cells 102 having floating gates, reference cells 116a, 116b, wordines 118 and bitlines 122. The wordlines 118 are connected to a column decoder 120, and the bitlines 122 are connected to a row decoder 124. A write voltage drive circuit 126 is connected to the row decoder 124, and a read voltage drive circuit 128 is connected to the column decoder 120 and the row decoder 124. The voltages used for programming and erasing the memory cells 102 are supplied to the row decoder 124 by the write voltage drive circuit 126, and the voltages required used for reading data from the memory cells 102 are supplied to the column decoder 120 and the row decoder 124 by the read voltage drive circuit 128.

In the non-volatile semiconductor memory device shown in FIG. 1, two reference cells 116a and 116b are connected to each wordline 118. One of the two reference cells 116a and 116b is placed into the "programmed" state, and the other is placed into the "erased" state. In the read operation, a desired wordline 118 is selected, and currents i0 and i1 flowing through the two reference cells 116a and 116b connected to the selected word line 118 are used to generate a reference current ire. In detail, the currents i0 and i1 flowing through the reference cells 116a and 116b are subjected to current calculation with converting circuits 130, 132, an adder circuit 134 and a converting circuit 136, and the reference current ire is thereby generated so as to have an intermediate current level between those of the currents i0 and i1. The data stored in the memory cell 102 are identified by comparing the cell current flowing through the memory cell 102 with the reference current ire by using a differential amplifier 138.

The non-volatile semiconductor memory device shown in FIG. 1 suffers from the following three problems:

First, the non-volatile semiconductor memory device shown in FIG. 1 suffers from the increase in the scale of the read circuitry. In the non-volatile semiconductor memory device shown in FIG. 1, two reference cells respectively placed in the "programmed" and "erased" states are connected to each wordline. This undesirably increases the number of the reference cells and increases the scale of the read circuitry. In addition, the non-volatile semiconductor memory device shown in FIG. 1 requires various circuits for generating the intermediate level current having a current level between those of the currents obtained from the "programmed" and "erased" reference cells, including the converting circuit 130, the converting circuit 132, the adder circuit 134 and the converting circuit 136. This also increases the scale of the read circuitry.

Second, the non-volatile semiconductor memory device shown in FIG. 1 suffers from the complicated operation sequence and/or circuit configuration. The non-volatile semiconductor memory device shown in FIG. 1, which incorporates both of "programmed" and "erased" reference cells, requires the programming operation for the "programmed" reference cell before the read operation from the memory cell 102. This undesirably complicates the operation of the memory device. In addition, the non-volatile semiconductor memory device shown in FIG. 1 requires a special operation sequence and/or circuit configuration in order to keep the "programmed" reference cell in the "programmed" state. For example, when "programmed" reference cells are formed within the same well as the memory cells 102, a programming operation is required for the "programmed" reference cells after the erasing operation for the memory cells 102. This undesirably makes the operation sequence complicated. Forming "programmed" reference cells within a different well from the memory cells 102 may avoid the complicated operation sequence; however, this undesirably makes the circuit configuration of the non-volatile semiconductor memory device complicated.

Finally, the non-volatile semiconductor memory device shown in FIG. 1 actually suffers from the poor adjustability of the reference current. In the non-volatile semiconductor memory device in FIG. 1, the reference current may be adjusted by changing the magnifications of the converting circuits 130, 132 and 136; however, this approach is not preferable from the viewpoint of the actual implementation. For example, when current mirrors are used as the converting circuits 130, 132 and 136, the control of the mirror ratios may be achieved by using transistors with different gate widths. This approach, however, undesirably requires integrating an increased number of transistors with different gate widths in order to finely adjust the reference current, causing the increase in the circuit scale. The reduction of the circuit scale may be achieved by reducing the number of the transistors prepared for the current mirrors; however, this approach makes it impossible to finely adjust the reference current.

SUMMARY

In an aspect of the present invention, a non-volatile semiconductor memory device is provided with: a first memory cell including a floating gate transistor; a first bitline connected to a diffusion layer which is used as a source of the first memory cell; a second bitline connected to a diffusion layer which is used as a drain of the first memory cell; a first reference cell including a floating gate transistor; a third bitline electrically isolated from the first bitline and connected to a diffusion layer which is used as a source of the first reference cell; a read circuit identifying data stored in the first memory cell in response to a memory cell signal received from the first memory cell through the second bitline and a reference signal received from the first reference cell through the fourth bitline; and a bitline level controller controlling a voltage level of the third bitline. The bitline level controller controls the third bitline to a voltage level different from that of the first bitline in a data read operation from the first memory cell.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a circuit diagram showing the details of the configuration of the non-volatile semiconductor memory device in the first embodiment;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. It should be noted that the same numerals denotes the same or equivalent elements in the attached drawings. If necessary, same elements denoted by the same numerals may be distinguished by suffix numbers attached to the numerals.

1. First Embodiment (Memory Device Configuration)

Figure 2:
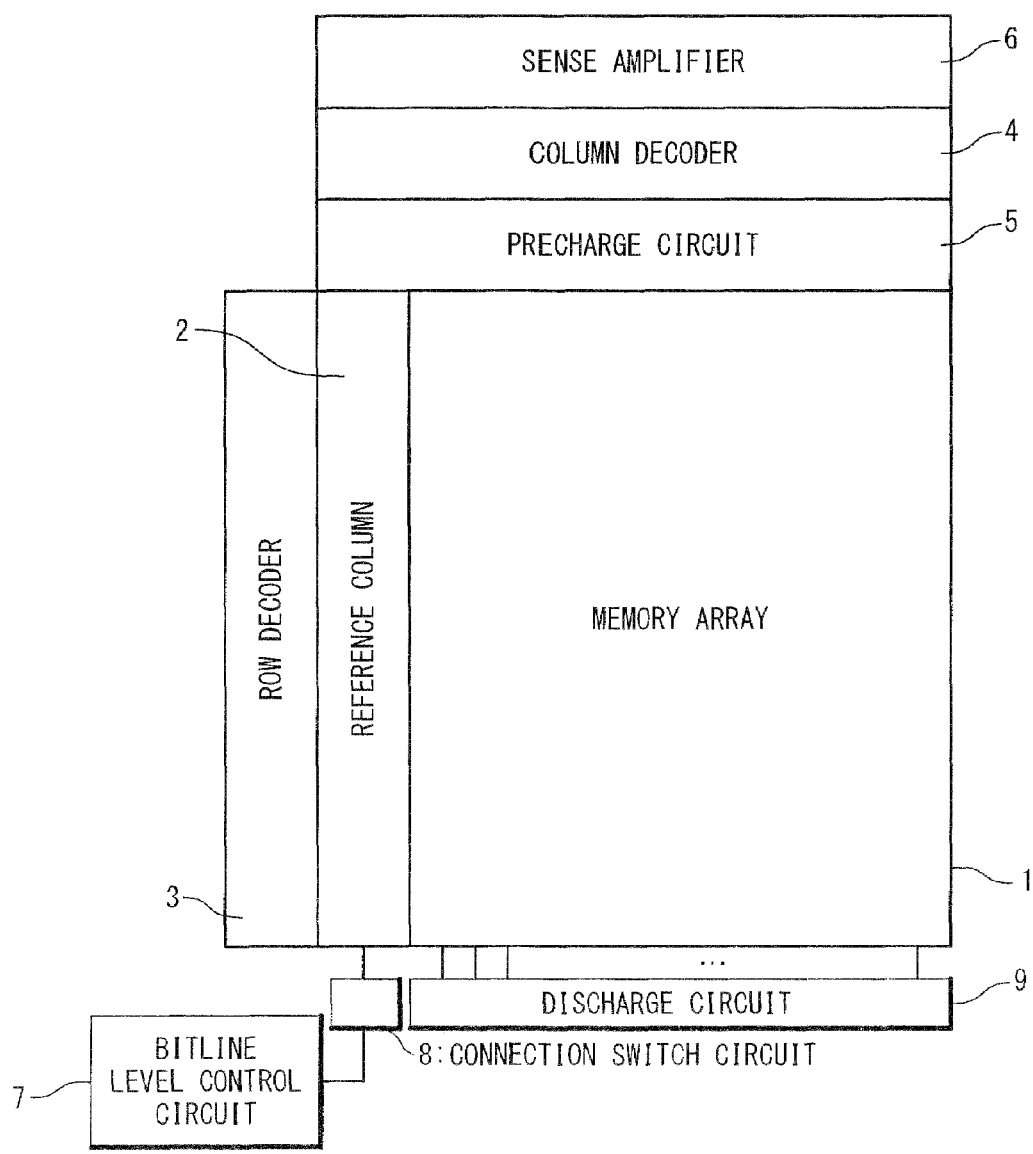
FIG. 2 is a block diagram showing an exemplary configuration of a non-volatile semiconductor memory device in a first embodiment of the present invention.

FIG. 2 is a block diagram showing the configuration of the non-volatile semiconductor memory device in a first embodiment of the present invention, and FIG. 3 is a view showing details of the configuration of the non-volatile semiconductor memory device shown in FIG. 2.

Referring to FIG. 2, the non-volatile semiconductor memory device of the first embodiment is provided with a memory array 1, a reference column 2, a row decoder 3, a column decoder 4, a precharge circuit 5, a sense amplifier 6, a bitline level control circuit 7, a discharging circuit 8 and a connection switch circuit 9.

FIG. 3 is a view showing the detailed configuration of the non-volatile semiconductor memory device of the first embodiment. The non-volatile semiconductor memory device of the first embodiment is a variation of "virtual ground" flash memories, in which bitlines connected to reference cells are prepared separately from those connected to memory cells.

Specifically, as shown in FIG. 3, the memory array 1 includes memory cells 21 arranged in rows and columns. Disposed along the rows of the memory cells 21 are bitlines BL0 to BLn, /BL0 to /Bln. Additionally, disposed along the columns of the memory cells are selection gates SG0 to SGm and control gates MG0 to MG(m+1). Every two bitlines BLi, /BLi arranged along the same row of the memory cells 21 constitute a bitline pair. The selection gates SG0 to SGm function as wordlines used to select the rows of the memory cells 21. The control gates MG0 to MG(m+1) are used to control the data programming into the memory cells 21 and the data reading from the memory cells 21. For simplicity, FIG. 3 only shows four bitlines BL0, /BL0, BL1 and /BL1, four selection gates SG0 to SG3 and five control gates MG0 to MG4.

Figure 4A:
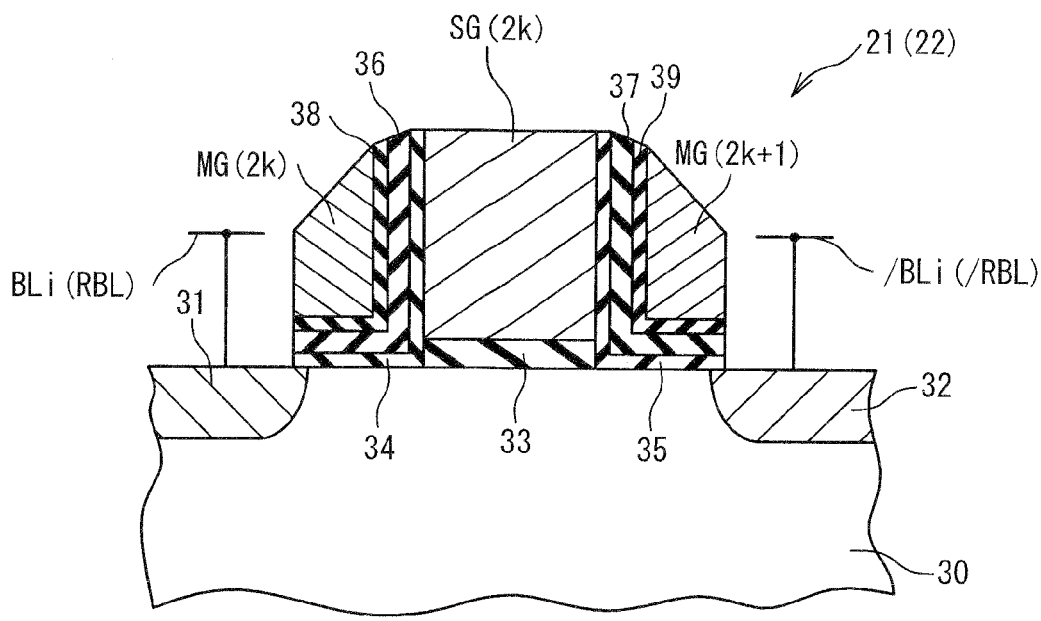
FIGS. 4A and 4B are sectional views showing exemplary configurations of a memory cell and a reference cell of the non-volatile semiconductor memory device in the first embodiment.
Figure 4B:
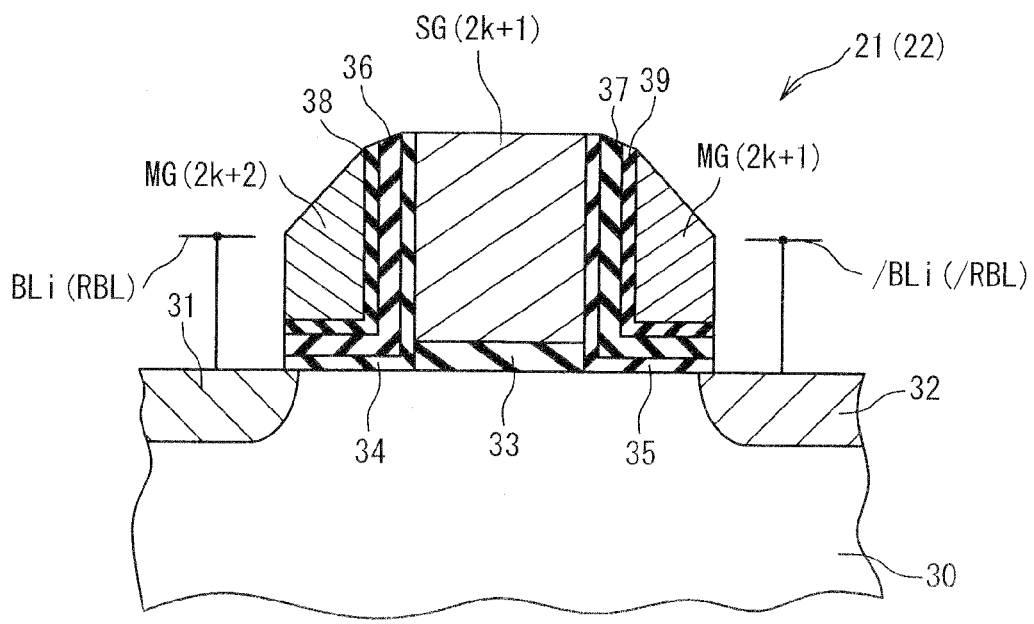

FIGS. 4A, 4B are sectional views showing the detailed structure of the memory cells 21. FIG. 4A shows the structure of the memory cells 21 associated with the even-numbered selection gates SG(2k), and FIG. 4B shows the structure of the memory cells 21 associated with the odd-numbered selection gates SG(2k+1). In this embodiment, the memory cells 21 are structured as the "twin MONOS" cell, which are designed to store two-bit data in each memory cell. In detail, each of the memory cells 21 is provided with: source/drain regions 31 and 32; gate oxide films 33, 34 and 35 formed on a substrate 30; floating gates 36 and 37 formed of silicon nitride films; and silicon oxide films 38 and 39. The source/drain regions 31 and 32 are connected to the bitlines BLi, /BLi, respectively. The floating gate 36 is positioned adjacent to the source/drain region 31 (which is connected to the bitline BLi), and the floating gate 37 is positioned adjacent to the source/drain region 32 (connected to the bitline /BLi).

In each memory cell 21, one of the two control gates is opposed to the floating gate 36, and the other is opposed to the floating gate 37. In detail, as shown in FIG. 4A, the control gate MG(2k) is opposed to the floating gate 36, and the control gate MG(2k+1) is opposed to the floating gate 37 in each memory cell 21 associated with the even-numbered selection gate SG(2k) (k is the integer of 0 or more). That is, the control gate MG(2k) is associated with the floating gate 36, and the control gate MG(2k+1) is associated with the floating gate 37. In the memory cells 21 associated with the odd-numbered selection gate SG(2k+1), on the other hand, the control gate MG(2k+1) is opposed to the floating gate 37, and the control gate MG(2k+2) is opposed to the floating gate 36 as shown in FIG. 4B. That is, the control gate MG(2k+1) is associated with the floating gate 37, and the control gate MG(2k+2) is associated with the floating gate 36.

The memory cells 21 stores one data bit as charges accumulated on the floating gate 36 and stores another data bit as charges accumulated on the floating gate 37. Moreover, the selection gate SGj of each memory cell 21 and the lower portion thereof function as a selection transistor. As thus described, each memory cell 21 functions as two data memory transistors and one selection transistor. Therefore, each memory cell 21 is shown as three series-connected transistors in FIG. 3.

As is well known in the art, the above-mentioned structure of the memory cells 21 allows programming data onto desired one of the floating gates 36 and 37 and reading data from desired one of the floating gates 36 and 37 through appropriately controlling the voltage levels of the selection gate SGj, the control gates MGj, MG(j+1) and the bitlines BLi, /BLi. As shown in FIG. 3, the voltage levels of the selection gate SGj and the control gates MGj, MG(j+1) are controlled by the row decoder 3, and the voltage levels of the bitlines BLi, /BLi are controlled by discharging switches 23, 24 within the connection switch circuit 9, respectively. As described later, the discharging switches 23, 24 have a function of connecting the bitlines BLi, /BLi to a ground terminal to pull down the bitlines BLi, /BLi to the ground level Vss.

It should be noted that both of the source/drain regions 31 and 32 of each memory cell 21 may be used as the source region in the data read operation. When the bitline BLi is pulled down to the ground level Vss, the source/drain region 31 connected to the bitline BLi functions as a source. On the other hand, when the bitline /BLi is pulled down to the ground level Vss, the source/drain region 32, connected to the bitline /BLi, functions as a source.

In the reference column 2, reference cells 22 each having a floating gate are arranged in a column, and a pair of reference bitlines RBL, /RBL are disposed long the column of the reference cells 22. The structure of the reference cells 22 are same as that of the memory cells 21 shown in FIGS. 4A and 4B, except that the source/drain regions 31 and 32 are connected to the reference bitlines RBL and /RBL, respectively. The reference bitlines RBL, /RBL are connected through connection switches 25 and 26 within the connection switch circuit 8 to the bitline level control circuit 7. Similarly to the memory cells 21, both of the source/drain regions 31 and 32 of the memory cell 21 may be used as a source.

In this embodiment, the reference cells 22 are kept in the "erased" state, in which charges are not accumulated on any of the floating gates 36 and 37.

In this embodiment, the memory array 1 and the reference column 2 are formed in the same well. This is important for performing the erasing operation for the memory cells 21 within the memory array 1 and the reference cells 22 within the reference column 2 at the same time. The memory cells 21 and the reference cells 22 can be erased at the same time by pulling up all the bitlines BL0 to BLn, /BL0 to /BLn to a predetermined positive voltage level (for example, 4.5 V), pulling down all the control gates MG0 to MG(m+1) to a predetermined negative voltage level (for example, −3 V), and pulling down all the selection gates SG are set at, for example, the ground level Vss.

The row decoder 3 controls the voltage levels of the selection gates SG0 to SGm and the control gates MG0 to MG(m+1) to thereby performing the selection of the rows of the memory cells 21 and the selection of the floating gates 36 and 37 in each memory cell 21.

The column decoder 4 includes column switches 41 to 44. The column switches 41 are connected between the bitlines BL0 to BLn and the sense amplifier 6, respectively, and the column switches 42 are connected between the bitlines /BL0 to /BLn and the sense amplifier 6, respectively. The column switch 43 is connected between the reference bitline RBL and the sense amplifier 6 and the column switch 44 is connected between the reference bitline /RBL and the sense amplifier 6. The column decoder 4 uses the column switches 41 and 42 to selectively connect a desired one of the bitlines BLi and /BLi to an input INi of the sense amplifier 6 and consequently selects the columns of the memory cells 21. Additionally, the column decoder 4 uses the column switches 43 and 44 to connect selected one of the reference bitlines RBL and /RBL to a reference input RIN of the sense amplifier 6.

The precharge circuit 5 includes precharge switches 51 to 54 formed of PMOS transistors. The precharge switches 51 and 52 are used to precharge the bitlines BL0 to BLn and /BL0 to /BLn to a precharge level $V_{PRE}$, respectively, and the precharge switches 53 and 54 are used to precharge the reference bitlines RBL and /RBL to the precharge level $V_{PRE}$, respectively. In one embodiment, the precharge level $V_{PRE}$ is set to the power supply level Vdd.

The sense amplifier 6 is configured to identify data stored in the memory cells 21. In detail, the sense amplifier 6 includes PMOS transistors 61, 62 and inverters 63. The source of the PMOS transistor 61 is connected to a power source terminal of the power supply level Vdd, and the drain thereof is connected to the reference input RIN. Correspondingly, the source of the PMOS transistor $62_i$ is connected to a power source terminal of the power supply level Vdd, and the drain thereof is connected to a data input INi. The gate of the PMOS transistor 61 is connected to the drain thereof, and also connected to the respective gates of the PMOS transistors 62. The input of the inverters $63_i$ is connected to the drain of the PMOS transistor $62_i$, and the output of the inverter $63_i$ is used as a data output $D_i$.

The sense amplifier 6 thus structured pulls up the data output Di to the "High" level (a power supply level Vdd) when the current drawn from the data input INi (the memory cell current) is larger than the current drawn from the reference input RIN (the reference current); otherwise, the sense amplifier 6 pulls down the data output $D_i$ to the "Low" level (the ground level Vss).

The bitline level control circuit 7 is configured to control the voltage levels of the reference bitlines RBL and /RBL. The fact that the bitline level control circuit 7 controls the reference bitline RBL independently of the bitlines BL0 to BLn and controls the reference bitline /RBL independently of the bitlines /BL0 to /BLn in the reading operation is important in the non-volatile semiconductor memory device in this embodiment, as described later.

(Read Operation)

In the following, a description is given of the read operation of the non-volatile semiconductor memory device of this embodiment. One feature of the read operation in this embodiment is that the voltage level of the source of the selected reference cell 22 is controlled independently of those of the sources of the selected memory cells 21, so that the reference current through the selected reference cell 22 is controlled to a desired current level. The change in the source voltage level of the selected reference cell 22 causes the change in the source-drain voltage thereof, and also causes the change in the threshold voltage of the selected reference cell 22 due to the substrate bias effect. With these effects, the reference current is varied correspondingly to the voltage level of the source of the selected reference cell 22. In this embodiment, the reference current is controlled to a desired current level through controlling the voltage level of the source of the selected reference cell 22.

In this embodiment, the reference cells 22 are preliminarily placed into the "erased" state (namely, the state in which charges are not accumulated on the floating gates 36 and 37 within the reference cells 22). In addition, the sources of the memory cells 21 from which data are to be read are set to the ground level Vss, while the source of the associated reference cell 22 used to generate the reference current is set to a voltage level α higher than the ground level Vss. This allows adjusting the reference current to a current level between the current level of the memory cell current through the "programmed" memory cell 21 and that of the memory cell current through the "erased" memory cell 21. The data stored in the selected memory cells 21 are identified by comparing the memory cell currents flowing through the selected memory cells 21 with the thus-generated reference current.

Figure 1:
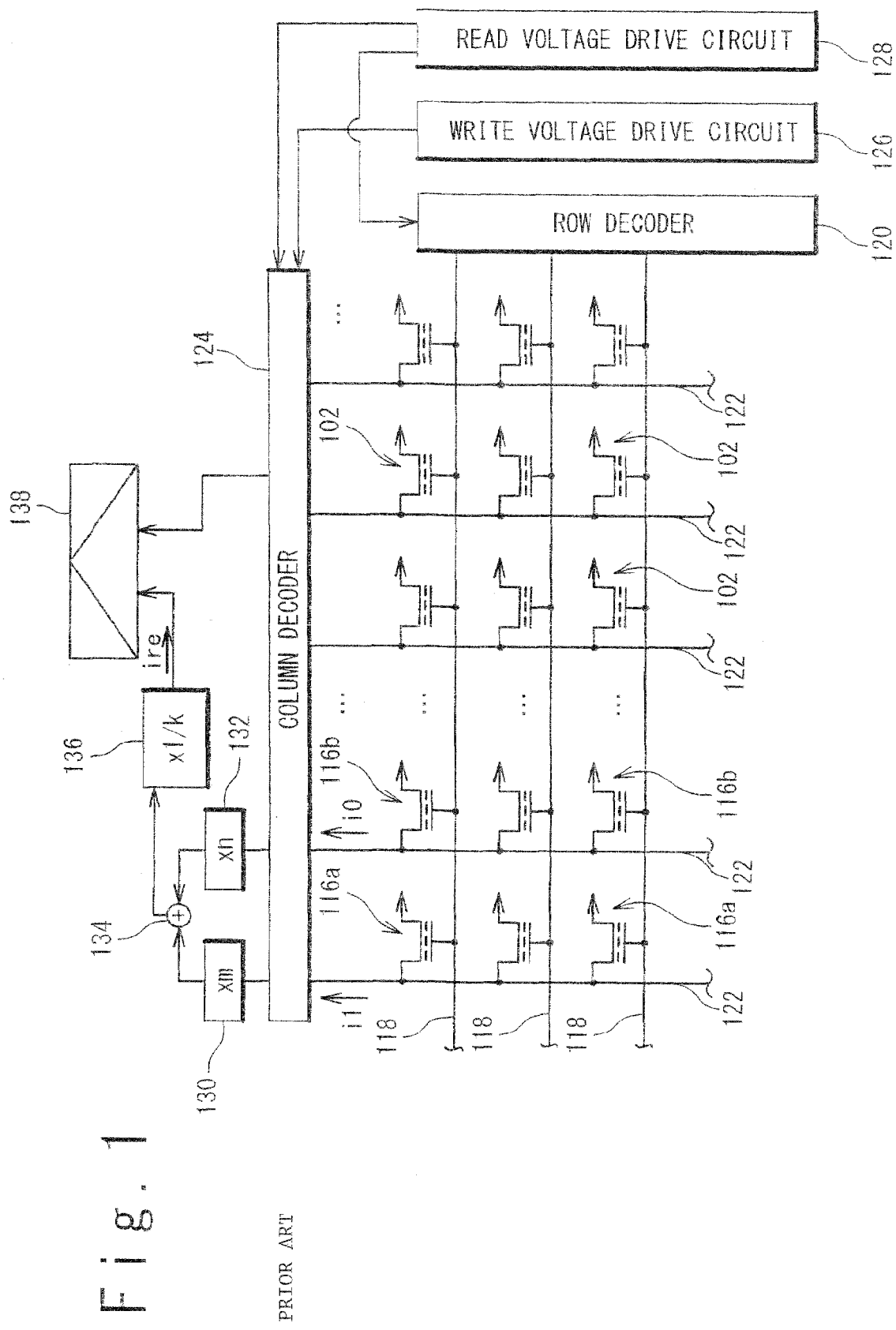
FIG. 1 is a circuit diagram showing a configuration of a conventional non-volatile semiconductor memory device.

The above-described data read operation has at least three advantages. One advantage is the reduced scale of the read circuitry. The non-volatile semiconductor memory device in this embodiment only requires "erased" reference cells in order to carry out the read operation; no "programmed" reference cell is used in the read operation. In addition, the current obtained from the reference cells 22 is used as the reference current as it is; the read operation of this embodiment eliminates the need for providing a special circuitry for generating the reference current of the intermediate level, differently from the non-volatile semiconductor memory device in FIG. 1. Accordingly, the non-volatile semiconductor memory device of this embodiment effectively reduces the scale of the read circuitry.

Second, the non-volatile semiconductor memory device of this embodiment allows simplifying the operation sequence and circuit configuration. The non-volatile semiconductor memory device of this embodiment, which incorporates only the "erased" reference cells 22, does not require performing the programming operation on the reference cells 22; the reference cells 22 are not subjected to the programming operation in this embodiment. There is no problem in the memory operation even if the "erased" reference cells 22 are formed in the same well as the memory cells 21. Subjecting both of the memory cells 21 and the reference cells 22 to the erasing operation does not destroy the function of the reference cells 22 at all. Therefore, the non-volatile semiconductor memory device of this embodiment effectively simplifies the operation sequence and circuit configuration.

Additionally, the non-volatile semiconductor memory device of this embodiment provides easy and fine adjustment of the current level of the reference current. In the non-volatile semiconductor memory device of this embodiment, the current level of the reference current is controlled in accordance with the voltage level of the source of the selected reference cell 22. As is understood by those skilled in the art, the fine adjustment of the voltage level of the source of the reference cell 22 can be easily achieved, providing the fine adjustment of the reference current generated by the selected reference cell 22.

Figure 5A:
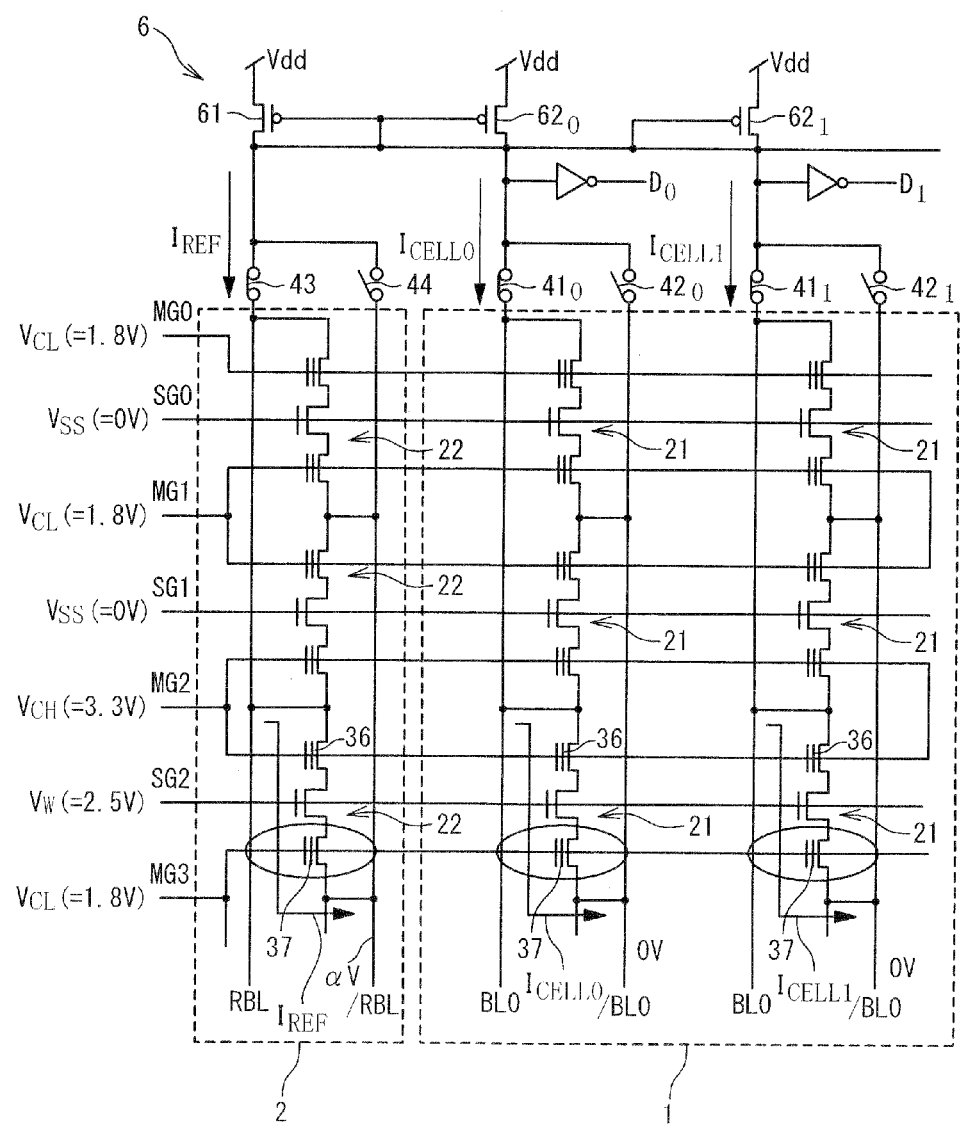
FIGS. 5A and 5B are conceptual views showing an exemplary read operation of the non-volatile semiconductor memory device in the first embodiment.
Figure 5B:
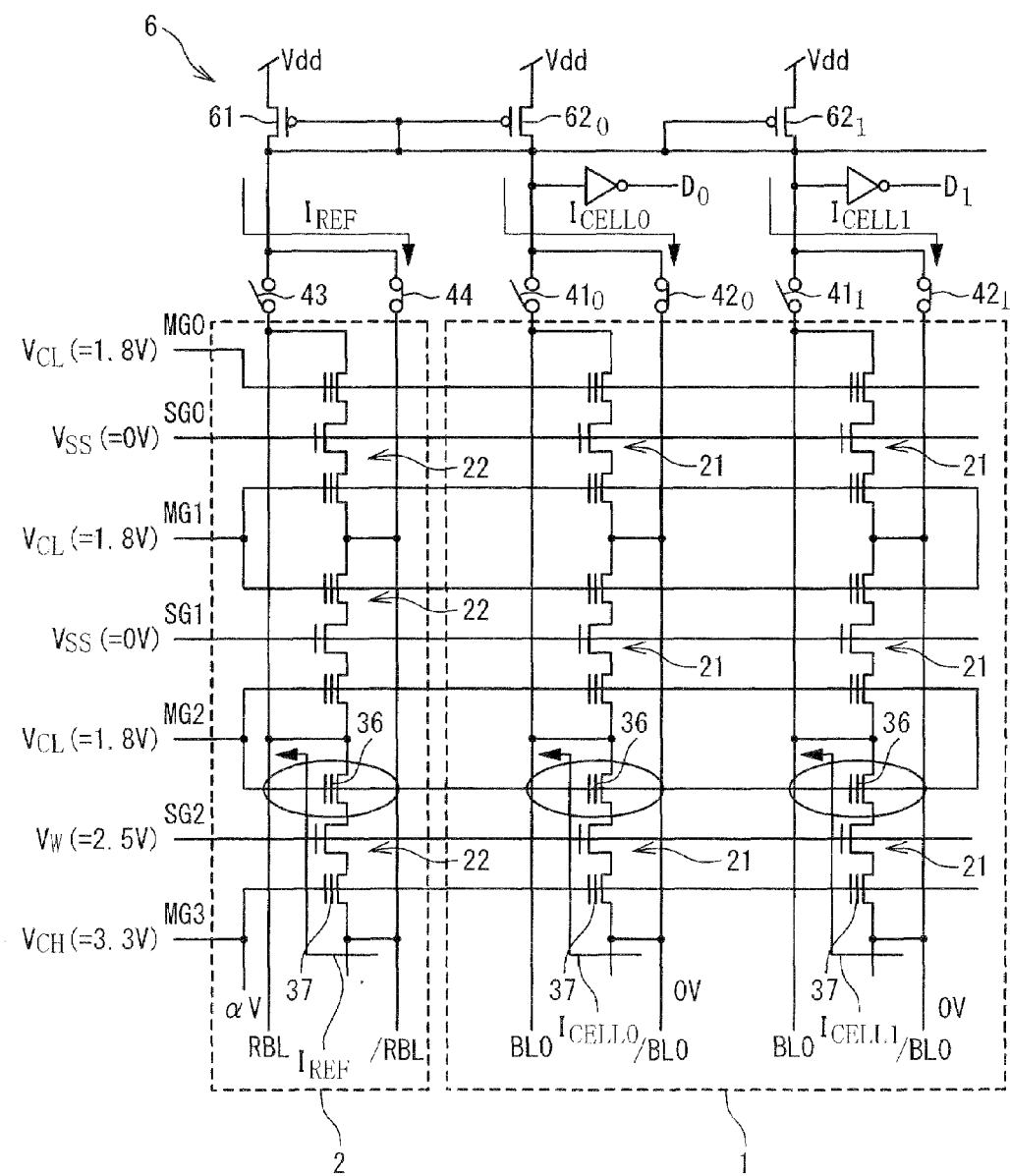

A detailed description is given of the read operation of the non-volatile semiconductor memory device of this embodiment with reference to FIGS. 5A and 5B. In the following, the operation of reading data stored in the memory cells 21 connected to the selection gate SG2 will be described. Those skilled in the art would appreciate that read operations from the memory cells 21 connected to other selection gate SGk are implemented in the same way.

At first, a description is given of the operation of reading data stored in the floating gates 37 (positioned near the bitlines /BL0 to /BLn) with respect to the memory cells 21 connected to the selection gate SG2. FIG. 5A is a conceptual view explaining the operation of reading data stored in the floating gates 37.

The initial state before the read operation is as follows: The column switches 41, 42, 43 and 44 within the column decoder 4 are turned off, and the precharge switches 51, 52, 53 and 54 of the precharge circuit 5 are also turned off. The control gates MG are pulled up to a positive voltage level $V_{CL}$. The voltage level $V_{CL}$ is, for example, 1.8 V. Also, the selection gates SG are pulled down to the ground level Vss. The bitline level control circuit 7 outputs the predetermined voltage level α which is higher than the ground level Vss and lower than the power supply level Vdd. Finally, the discharging switches 23, 24 and the connection switches 25 and 26 are turned on. Consequently, the bitlines BL0 to BLn and /BL0 to /BLn are pulled down to the ground level Vss, and the reference bitlines RBL and /RBL are set to the voltage level α. In this embodiment, the read operation is started from this state.

The operation of reading the data stored in the floating gates 37 is as follows: At first, the discharging switches 23 and the connection switch 25 are turned off and the precharge switches 51 and 53 are turned on. This allows precharging the bitlines BL0 to BLn and the reference bitline RBL to the precharge level $V_{PRE}$. After the precharge of the bitlines BL0 to BLn and the reference bitline RBL is completed, the precharge switches 51 and 53 are turned off.

This is followed by turning on the column switches 41 of the column decoder 4 to electrically connect the bitlines BL0 to BLn to the inputs IN0 to INn of the sense amplifier 6. In the meantime, the column switch 43 is also turned on to connect the reference bitline RBL to the reference input RIN.

In addition, the selection gate SG2 is pulled up to a positive voltage level $V_W$ to thereby select the memory cells 21 and the reference cell 22 which are connected to the selection gate SG2. The voltage level $V_W$ of the selection gate SG2 is controlled so that the selection transistors of the selected memory cells 21 are turned on. The voltage level $V_W$ is, for example, 2.5 V.

In addition, the control gate MG2, which is associated with the floating gates 36 in the memory cells 21 associated with the selection gate SG2, is pulled up to a voltage level $V_{CH}$ higher than the voltage level $V_W$. This results in that the cell currents $I_{CELL0}$ to $I_{CELLn}$ flowing through the selected memory cells 21 and the reference current $I_{REF}$ flowing through the selected reference cell 22 do not depend on the data stored in the floating gates 36. Other control gates MG are still kept at a positive voltage level $V_{CL}$ lower than the voltage level $V_W$. The voltage level $V_{CH}$ is, for example, 3.3 V, and the voltage level $V_{CL}$ is, for example, 1.8 V.

Such operations results in that the memory cell currents $I_{CELL}$ flows through the respective memory cells 21 connected to the selection gate SG2, and the reference current $I_{REF}$ flows through the reference cell 22 connected to the selection gate SG2, as shown in FIG. 5A. The current levels of the memory cell currents $I_{CELL}$ depend on the data stored in the floating gates 37 in the selected memory cells 21.

The data output Di is pulled up to the "High" level (or the power supply level Vdd) when the memory cell current $I_{CELLi}$ is larger than the reference current $I_{REF}$; otherwise, the data output Di is pulled down to the "Low" level (or the ground level Vss).

In this operation, the bitline level control circuit 7 controls the reference bitline /RBL to the predetermined voltage level α, which is higher than the ground level Vss and lower than the power supply level Vdd. The fact that the reference bitline/RBL is kept at the voltage level α results in that the source of the selected reference cell 22 is kept at the voltage level α, since the source/drain region 32 connected to the reference bitline /RBL is used as the source during the operation of reading the data stored in the floating gates 37 of the selected memory cells 21. Therefore, the reference current $I_{REF}$ is controlled to a desired current level through controlling the voltage level α of the source of the selected reference cell 22, allowing reliably identifying the data of the selected memory cells 21.

This is followed by pulling down the selection gate SG2 to the ground level Vss, and pulling down the control gate MG2 to the voltage level $V_{CL}$. In the meantime, the column switches 41 and 43 are turned off, and the discharging switch 23 and the connection switch 25 are turned on. This results in that the state of the memory device is returned to that before the read operation, completing the preparation for the next read operation.

FIG. 5B is a conceptual view showing the operation of reading data stored in the floating gates 36 of the memory cells 21. In the operation of reading the data stored in the floating gates 36, the cell currents $I_{CELL0}$ to $I_{CELLn}$ and the reference current IREF flows through the selected memory cells 21 and reference cell 22 in the opposite direction.

In detail, after the preparation for the read operation is completed, the discharging switches 24 and the connection switch 26 are turned off, and the precharge switches 52 and 54 are turned on. This achieves precharging the bitline /BL and the reference bitline /RBL to the precharge level $V_{PRE}$. After the precharge is completed, the precharge switches 52 and 54 are turned off.

This is followed by turning on the column switches 42 in the column decoder 4 to electrically connect the bitlines /BL0 to /BLn to the inputs IN0 to INn of the sense amplifier 6, and also turning on the column switch 44 to electrically connect the reference bitline /RBL to the reference input RIN.

In addition, the selection gate SG2 is pulled up to the positive voltage level $V_W$. The voltage level $V_W$ of the selection gate SG2 is controlled so that the selection transistors within the selected memory cells 21 are turn on. The voltage level $V_W$ is, for example, 2.5 V.

Furthermore, the control gate MG3, which is associated with the floating gates 37 in the memory cells 21 associated with the selection gate SG2, is pulled up to the voltage level $V_{CH}$, which is higher than the voltage level $V_W$. This results in that the cell currents $I_{CELL0}$ to $I_{CELLn}$ flowing through the memory cells 21 associated with the selection gate SG2 do not depend on the data held in the floating gates 37. Other control gates MG are kept at the positive voltage level $V_{CL}$ lower than the voltage level $V_W$. The voltage level $V_{CH}$ is, for example, 3.3 V.

Such operations results in that the memory cell currents $I_{CELL0}$ to $I_{CELLn}$ flow through the memory cells 21 connected to the selection gate SG2, and the reference current $I_{REF}$ flows through the reference cell 22 connected to the selection gate SG2. The current level of each memory cell current $I_{CELLi}$ depends on the data stored in the floating gate 37 in the associated memory cell 21. The data output Di is pulled up to the "High" level (or the voltage level Vdd) when the memory cell current $I_{CELLi}$ is larger than the reference current $I_{REF}$; otherwise, the data output Di is pulled down to the "Low" level (or the ground level Vss).

In this operation, the bitline level control circuit 7 keeps the reference bitline RBL at the predetermined voltage level α higher than the ground level Vss. The reference current $I_{REF}$ is controlled to a desired current level by controlling the voltage level α, allowing reliably identifying the data of the selected memory cells 21.

As thus described, the non-volatile semiconductor memory device in this embodiment is configured to control the source of the selected reference cell 22, which is placed in the "erased" state, to a proper voltage level higher than the voltage level of the source of the selected memory cells 21. Such configuration allows (1) reducing the scale of the read circuitry, (2) simplifying the operation sequence, and (3) easily and finely adjusting the current level of the reference current.

It should be noted that the reference cells 22 may be placed into the "programmed" state instead of the "erased" state. In this case, the voltage level α of the reference bitline RBL (or /RBL) connected to the reference cells 22 is controlled to a proper voltage level lower than the voltage levels of the bitlines BL0 to BLn (or /BL0 to /BLn) connected to the memory cells 21. When the voltage levels of the bitlines BL0 to BLn (or /BL0 to /BLn) connected to the memory cells 21 are the ground level Vss, the voltage level α of the reference bitline RBL (or /RBL) connected to the reference cells 22 is set to a negative level. This operation is also effectively for reducing the scale of the read circuitry and allowing easy and fine adjustment of the reference current.

It should be also noted that it is more preferable that the reference cells 22 are placed into the "erased" state from the viewpoint of the operation sequence simplicity. As mentioned above, the operation in which the reference cells 22 are placed into the "erased" state is advantageous in terms of the simplicity of the operation sequence, eliminating the need for subjecting the reference cells 22 to the programming operation. Forming the memory cells 21 and the reference cells 22 within the same well allows placing the reference cells 22 into the "erased" state with simple operation; the reference cells 22 can be erased at the same time by the erasing operation of the memory cells 21.

2. Second Embodiment (Memory Device Configuration)

Figure 6:
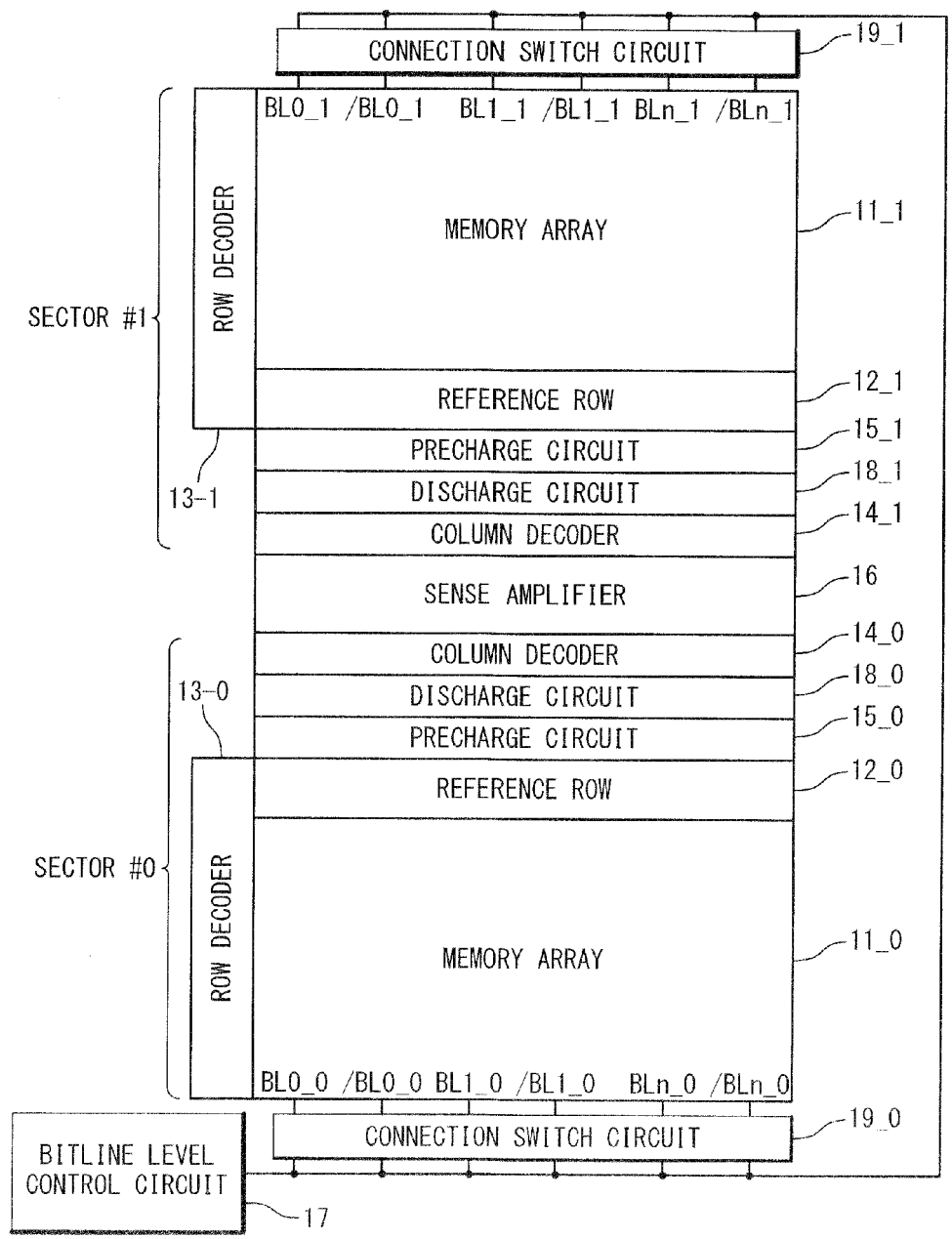
FIG. 6 is a block diagram showing a configuration of a non-volatile semiconductor memory device in a second embodiment.

FIG. 6 is a block diagram showing an exemplary configuration of the non-volatile semiconductor memory device in a second embodiment of the present invention. The main difference of the non-volatile semiconductor memory device of the second embodiment from that of the first embodiment is that the sense amplifier is designed to amplify the voltage level difference between the bitlines, similarly to DRAMs (Dynamic Random Access Memory), for example. As described above, the non-volatile semiconductor memory device of the first embodiment is designed to identify the memory cell data by comparing the currents flowing through the memory cells with the reference current. On the other hand, the non-volatile semiconductor memory device of the second embodiment is designed to identify the data by comparing the voltage levels of the bitlines connected to the memory cells with the voltage levels of the bitlines connected to the reference cells.

In association with the change in the configuration as mentioned above, the reference cells are arranged in the row direction (the direction in which the selection gates (wordlines) are extended) in the non-volatile semiconductor memory device of the second embodiment. As described later, the configuration in which the reference cells are arranged in the row direction is important to equalize the capacitances between the bitlines connected to the sense amplifier and to thereby simplify the data identification based on the voltage level difference between the bitlines. In the following, a detail description is given of the non-volatile semiconductor memory device of the second embodiment.

The non-volatile semiconductor memory device of the second embodiment is provided with memory arrays 11, reference rows 12, row decoders 13, column decoders 14, precharge circuits 15, a sense amplifier 16, a bitline level control circuit 17, discharging circuits 18 and connection switch circuits 19. In the non-volatile semiconductor memory device of this embodiment, one sense amplifier 16 is prepared for two sectors #0 and #1. Hereinafter, suffix numbers of "_0" or "_1" may be attached to the numerals for distinguishing the same elements within the different sectors. For example, the memory array 11 within the sector #0 is referred to as the memory array 11_0, and the memory array 11 within the sector #1 is referred to as the memory array 11_1. It should be noted that suffix numbers are not attached when it is unnecessary to identify the sector.

Figure 7A:
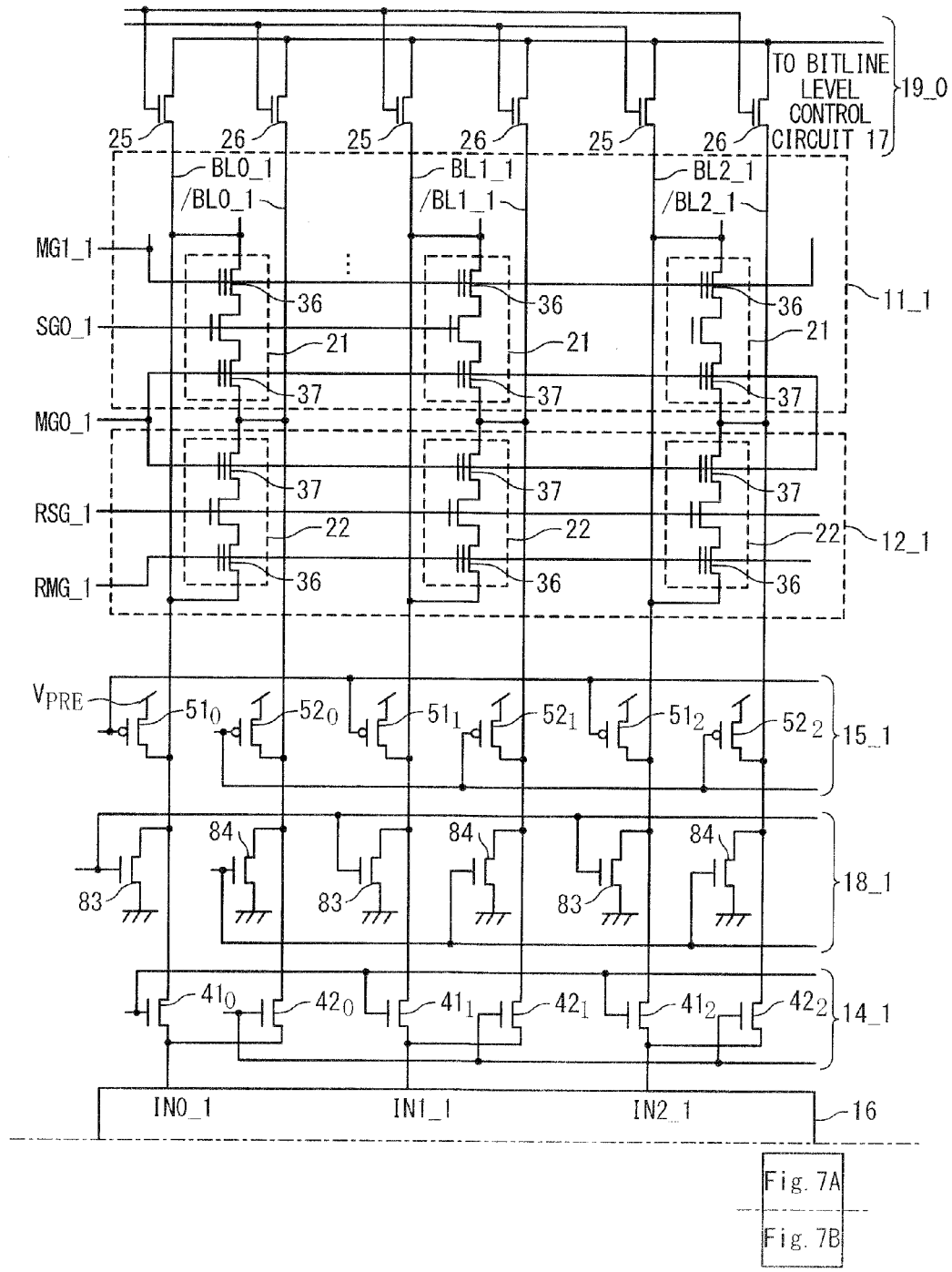
FIGS. 7A and 7B are circuit diagrams showing details of the configuration of the non-volatile semiconductor memory device in the second embodiment.
Figure 7B:
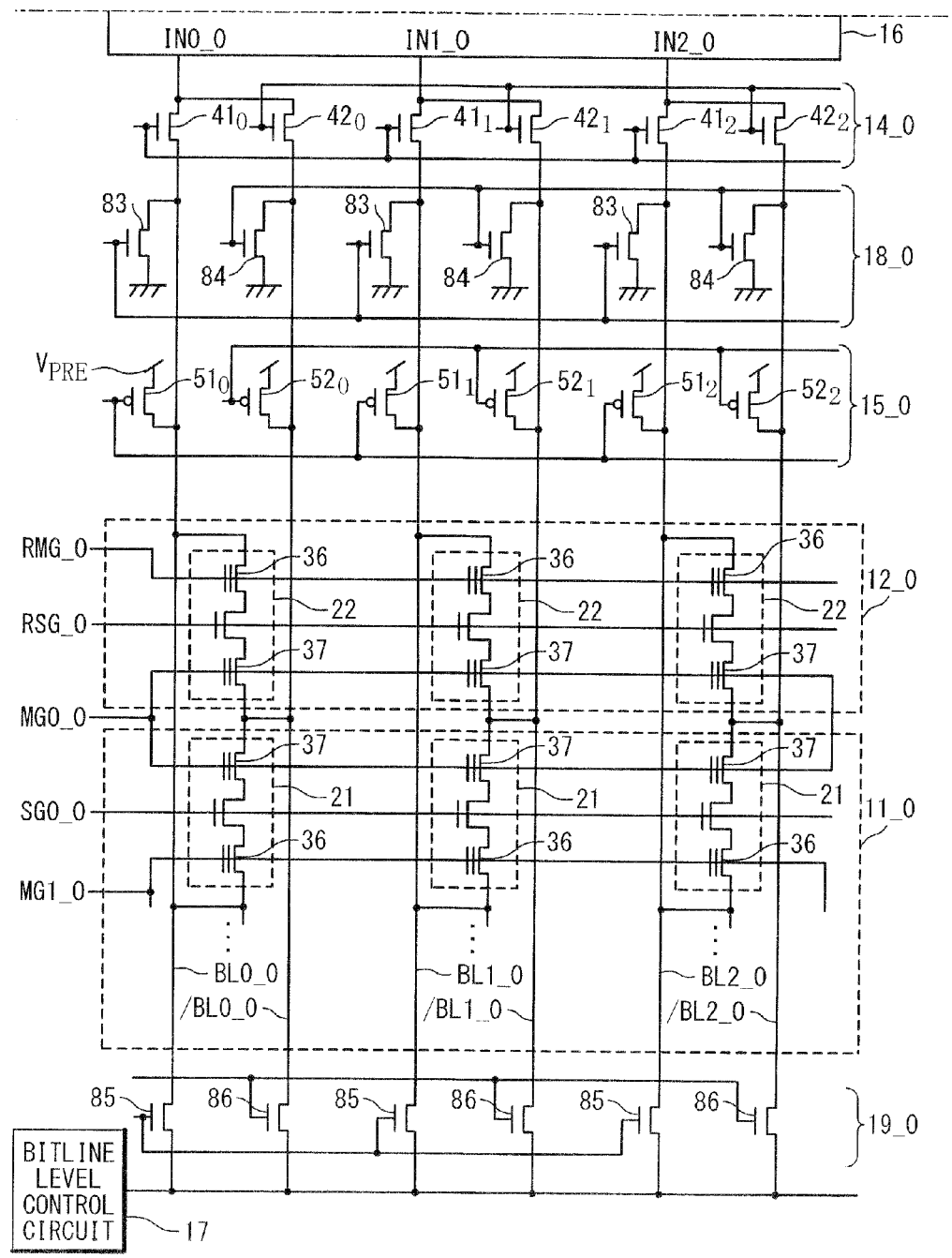

As shown in FIGS. 7A and 7B, memory cells 21 are arranged in rows and columns in the memory arrays 11, and a pair of bitlines BLi and /BLi are provided along each column of the memory cells 21. The memory cells 21 each have the structure shown in FIGS. 4A and 4B. The rows of the memory cells 21 are selected by the selection gates SGk, and the floating gates 36 and 37 within each memory cell 21 are selected by the control gates MGk and MG(k+1).

Reference cells 22 are arranged in each reference row 12. The reference row 12_0 is provided adjacent to the memory array 11_0, and the reference row 12_1 is provided adjacent to the memory array 11_1. Each reference cell 22 in the reference rows 12 has the same structure as that of the memory cells 21 shown in FIGS. 4A and 4B.

In this embodiment, selection gates RSG are dedicatedly prepared for the reference cells 22, which are arranged in the row direction. In addition, control gates RMG are dedicatedly prepared for the floating gates 36 of the reference cells 22. The control gates associated with the floating gates 37 of the reference cells 22 are commonly connected to the control gates of the memory cells 21 adjacent thereto, which are referred to as the control gate MG0.

The memory cells 21 and the reference cells 22 are formed in the same well in each sector. That is, the memory and reference cells 21 and 22 of the sector #0 are formed in the same well, sharing the same bitlines. This is important in subjecting the memory cells 21 and the reference cells 22 to the erasing operation at the same time. The memory cells 21 and the reference cells 22 can be erased at the same time by pulling up all the bitlines BL0 to BLn, /BL0 to /BLn to a predetermined positive voltage level (for example, 4.5 V), pulling down all the control gates MG0 to MG(m+1) and RMG to a predetermined negative voltage level (for example, −3 V) and pulling down all the selection gates SG, RSG to, for example, the ground level Vss, When the erasing operation is performed on each sector, the memory cells 21 and the reference cells 22 in each sector are placed into the "erased" state at the same time.

The row decoders 13 each control the voltage levels of the selection gates SG0 to SGm and the control gates MG0 to MGm+1 to thereby performs the selection of the rows of the memory cells 21 and the selection of the floating gates 36 and 37 in each memory cell 21. In addition, the row decoder 13 controls the voltage levels of the selection gate RSG and control gate RMG of the reference rows 12 to thereby performs the selection of the reference rows 12.

The column decoders 14 each include column switches 41 and 42. The column decoders 14 use the column switches 41 and 42 to electrically connect the bitlines BL0 to BLn or /BL0 to /BLn to the inputs IN0 to INn of the sense amplifier 16.

The precharge circuits 15 each include precharge switches 51 and 52 composed of the PMOS transistors. The precharge switches 51 are used to precharge the bitlines BL0 to BLn and /BL0 to /BLn to the precharge level $V_{PRE}$. In one embodiment, the precharge level $V_{PRE}$ is set to the power supply level Vdd.

The sense amplifier 16 is used to identify data stored in the selected memory cells 21. The sense amplifier 16 is designed to amplify the voltage level difference between the input INi_0 connected to the memory array 11_0 and the input INi_1 connected to the memory array 11_1, and to thereby identify the data stored in the memory cells 21. As described later, one of the bitlines BLi_0, /BLi_0 of the sector #0 is connected to the input INi_1, and one of the bitlines BLi_1, /BLi_1 of the sector #1 is connected to the input INi_1 in the read operation. The data stored in the selected memory cells 21 are then identified on the basis of the voltage level difference between the inputs INi_0 and INi_1.

Figure 8:
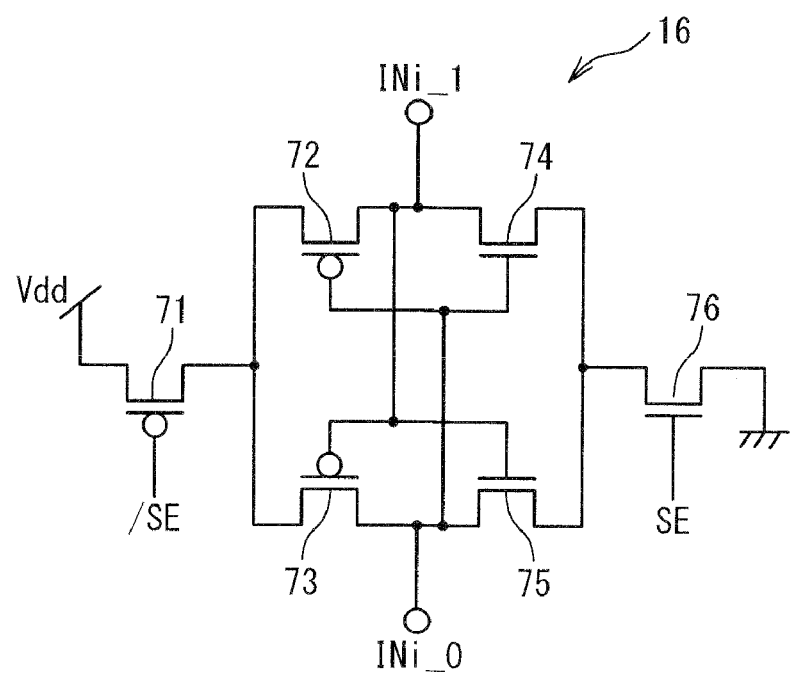
FIG. 8 is a circuit diagram showing an exemplary circuit configuration of a sense amplifier in the second embodiment.

The sense amplifier 16 may be structured identically to a typical sense amplifier used in DRAMs, which is designed to amplify the voltage difference. FIG. 8 is a circuit diagram, showing an exemplary configuration of the sense amplifier 16. In one embodiment, the sense amplifier 16 is composed of PMOS transistors 71 to 73 and NMOS transistors 74 to 76. The sense amplifier 16 structured as shown in FIG. 8 amplifies the voltage level difference between the input INi_0 and the input INi_1, when a sense amplifier enable signal SE is pulled up to the "High" level and a sense amplifier enable signal /SE is pulled down to the "Low" level. This results in that one input with a relatively higher voltage level out of the inputs INi_0 and INi_1 is pulled up to the "High" level, and the other with a relatively low voltage level is pulled down to the "Low" level.

Referring back to FIGS. 7A and 7B, the bitline level control circuit 17 has a function of controlling the voltage levels of the bitlines BL0 to BLn, /BL0 to /BLn of the memory array 11. In detail, the bitline level control circuit 17 has a function of connecting the bitlines BL0 to BLn and /BL0 to /BLn to a node of the voltage level α.

The discharging circuits 18 each include discharging switches 83, 84. The discharging switches 83 are used to connect the bitlines BL0 to BLn to the ground terminal to thereby discharge the bitlines BL0 to BLn to the ground level. On the other hand, the discharging switches 84 are used to connect the bitlines /BL0 to /BLn to the ground terminal to thereby discharge the bitlines /BL0 to /BLn to the ground level.

The connection switch circuit 19_0 includes connection switches 85 and 86, and the connection switch circuit 19_1 includes connection switches 25 and 26. The connection switches 85 have a function of connecting or disconnecting the bitlines BL0_0 to BLn_0 of the sector #0 to the bitline level control circuit 17 and the connection switches 86 have a function for connecting or disconnecting the bitlines /BL0_0 to /BLn_0 of the sector #0 to the bitline level control circuit 17. Correspondingly, the connection switches 25 have a function of connecting or disconnecting the bitlines BL0_1 to BLn_1 of the sector #1 to the bitline level control circuit 17, and the connection switches 26 have a function of connecting or disconnecting the bitlines /BL0_1 to /BLn_1 of the sector #0 to the bitline level control circuit 17.

(Read Operation)

In the following, a description is given of the read operation of the non-volatile semiconductor memory device of this embodiment. Also in the read operation in this embodiment, similarly to the first embodiment, the reference cells 22 are preliminarily placed into the "erased" state (namely, the state in which charges are not accumulated on the floating gates 36 and 37 of the reference cells 22), and the voltage levels of the sources of the reference cells 22 are controlled independently of the voltage levels of the sources of the memory cells 21. This allows controlling the reference current flowing through the reference cells 22 to a desired current level.

The difference of the read operation in the second embodiment from that in the first embodiment is that the sense amplifier 16 identifies the data stored in the selected memory cells 21 on the basis of the voltage level difference between the bitlines connected to the selected reference cells 22 and the bitlines connected to the selected memory cells 21 in the second embodiment.

It should be noted that it is desirable in such operation that the difference in the capacitance is reduced between the two bitlines used in reading data from each memory cell 21. The large difference in the bitline capacitance may differentiate the behaviors of the changes in the voltage levels of the two bitlines. This is not preferable for reliably reading the data from the memory cell 21.

In order to reduce the capacitance difference between two bitlines used in the read operation from each selected memory cell 21, special architecture is used in this embodiment, in which the reference cells 22 within the sector #1 are used for reference level generation when data are read from the memory cells 21 within the sector #0, while the reference cells 22 within the sector #0 are used for reference level generation when data are read from the memory cells 21 within the sector #1. Such architecture allows the sectors #0 and #1 to be symmetrically configured with each other, effectively reducing the capacitance difference between two bitlines used in the read operation from each selected memory cell. In an ideal case, the capacitance difference is supposed to be reduced down to zero.

A description is given of the read operation from the memory cells 21 connected to the selection gate SG0_0 of the memory array 11_0 of the sector #0. It should be noted that the reference cells 22 of the sector #1 are used for the reference levels when data are read from the memory cells 21 within the sector #0. Those skilled in the art would appreciate that read operations from the memory cells 21 connected to other selection gates are implemented in the same way.

The initial state just before the read operation starts is as follows: The column switches 41 and 42 of the column decoders 14 are turned off, and the precharge switches 51 and 52 of the precharge circuits 15 are also turned off. The control gates MG and RMG are pulled up to the positive voltage level $V_{CL}$. The voltage level $V_{CL}$ is, for example, 1.8 V. Also, the selection gates SG and RSG are pulled down to the ground level Vss. Also, the bitline level control circuit 7 outputs the predetermined voltage level α, which is higher than the ground level Vss and lower than the power supply level Vdd. The discharging switches 83 and 84 in the discharging circuits 18 are turned on, while the connection switches 25, 26, 85 and 86 in the connection switch circuits 19 are turned off. As a result, the bitlines BL0 to BLn and /BL0 to /BLn are pulled down to the ground level Vss. In this embodiment, the read operation is started from this state.

Figure 9A:
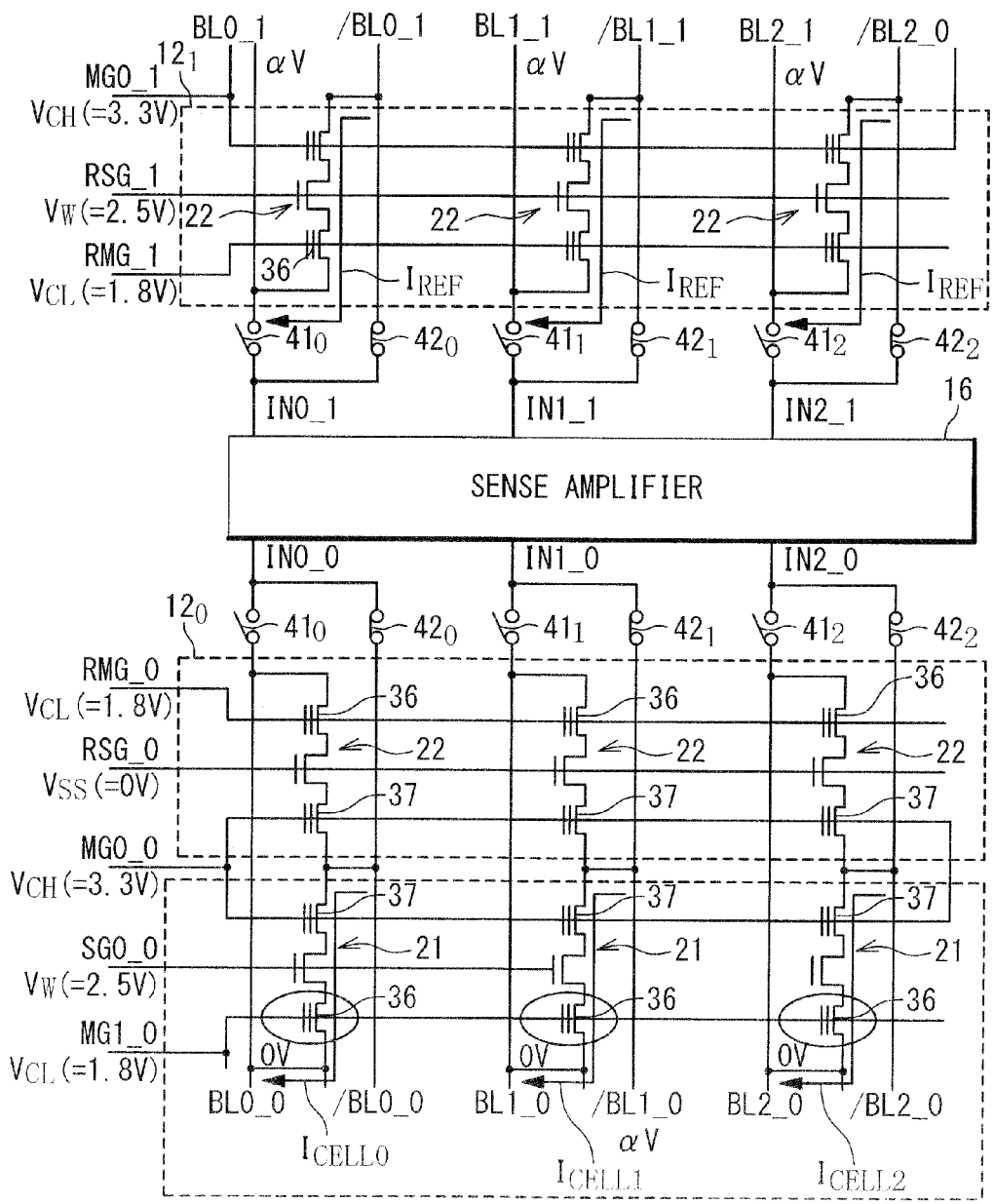
FIGS. 9A and 9B are conceptual views showing a reading operation of the non-volatile semiconductor memory device in the second embodiment.

First, a description is given of the operation of reading data stored in the floating gates 36 of the respective memory cells 21 connected to the selection gate SG0_0. It should be noted that the floating gates 36 denotes the floating gates which are positioned near the bitlines BL0_0 to BLn_0. As shown in FIG. 9A, the read operation from the floating gates 36 of the memory cells 21 connected to the selection gate SG0_0 of the sector #0 involves comparing the voltage levels of the bitlines /BL0_0 to /BLn_0 of the sector #0 with the voltage levels of the bitlines /BL0_1 to /BLn_1 of the sector #1. The data stored in the floating gates 36 of the memory cells 21 connected to the selection gate SG0_0 are identified by comparing the voltage levels of the bitlines /BL0_0 to /BLn_0 of the sector #0, which depend on the data stored in the floating gates 36 of the memory cells 21 connected to the selection gate SG0_0, with reference voltages generated on the bitlines /BL0_1 to /BLn_1 of the sector #1 by the reference cells 22.

More specifically, the operation of reading the data stored in the floating gates 36 begins with turning off the discharging switches 84 in the discharging circuit 18_0 of the sector #0 and the discharging switches 83 and 84 in the discharging circuit 18_1 of the sector #1. This is followed by turning on the precharge switches 52 of the precharge circuits 15_0 and 15_1 while turning on the connection switches 25 of the connection switch circuit 19_1. This results in that the bitlines /BL0_0 to /BLn_0 of the sector #0 and the /BL0_1 to /BLn_1 of the sector #1 are precharged to the precharge level $V_{PRE}$, while the bitlines BL0_1 to BLn_1 of the sector #1 are set to the voltage level α. After the precharge is completed, the precharging switches 52 are turned off.

This is followed by pulling up the selection gate SG0_0 to the positive voltage level $V_W$ in the sector #0, and also pulling up the selection gate RSG_1 to the positive voltage level $V_W$ in the sector #1, as shown in FIG. 9A. As a result, the memory cells 21 connected to the selection gate SG0_0 are selected in the sector #0, while the reference cells 22 connected to the selection gate RSG_1 are selected in the sector #1. The voltage levels $V_W$ of the selection gates SG0_0 and RSG_1 are controlled so that the selection transistors within the associated memory cells 21 and reference cells 22 are turned on. The voltage level $V_W$ is, for example, 2.5 V.

Furthermore, the control gate MG0_0, which is associated with the floating gates 37 of the memory cells 21 associated with the selection gate SG0_0, is pulled up to the voltage level $V_{CH}$, which is higher than the voltage level $V_W$, and the control gate MG0_1, which is associated with the floating gates 37 of the reference cells 22 of the sector #1, is pulled up to the voltage level $V_{CH}$. As a result, the cell currents flowing through the memory cells 21 associated with the selection gate SG0_0 do not depend on the data stored in the floating gates 37. Other control gates MG are kept at the positive voltage level $V_{CL}$, which is lower than the voltage level $V_W$. The voltage level $V_{CH}$ is, for example, 3.3 V.

In addition, the column switches $42_0$ to $42_n$ are turned on in both of the sectors #0 and #1. This allows the bitlines /BL0_0 to /BLn_0 of the sector #0 to be connected to the inputs IN0_0 to INn_0 of the sense amplifier 16, and the bitlines /BL0_1 to /BLn_1 of the sector #1 to be connected to the inputs IN0_1 to INn_1 of the sense amplifier 16.

Figure 10:
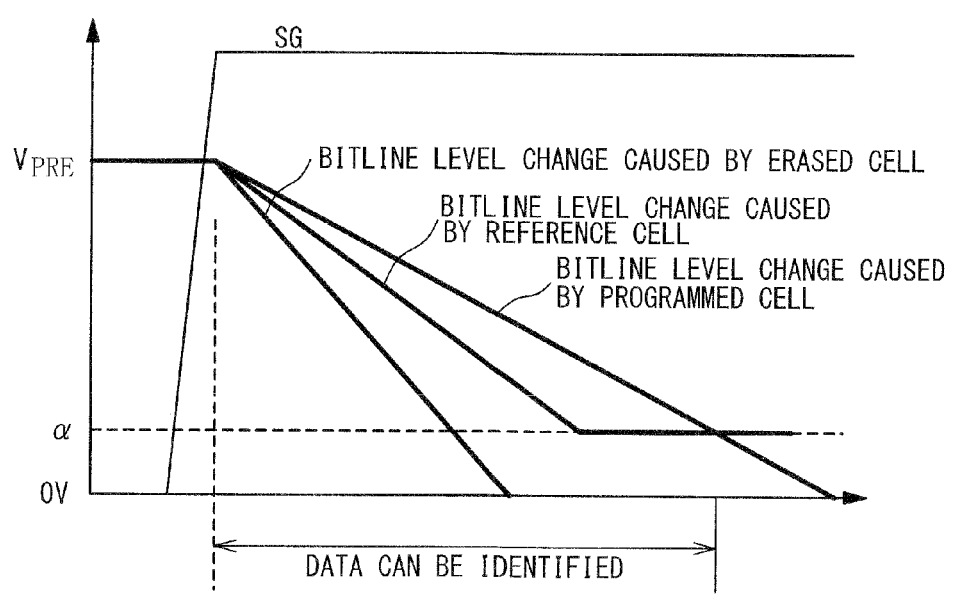
FIG. 10 is a graph explaining behaviors of bitline voltage levels in the non-volatile semiconductor memory device in the second embodiment.

As shown in FIG. 10, such operations results in that the voltage levels of the bitlines /BL0_0 to /BLn_0, /BL0_1 to /BLn_1 of the sectors #0 and #1 are gradually decreased towards the ground level Vss from the pre-charge level $V_{PRE}$. In detail, immediately after the bitlines /BL0_0 to /BLn_0, /BL0_1 to /BLn_1 of the sectors #0, #1 are precharged, the voltage levels of the bitlines /BL0_0 to /BLn_0, /BL0_1 to /BLn_1 are the precharge level $V_{PRE}$. The voltage levels of the bitlines /BL0_0 to /BLn_0 are then decreased due to the cell currents $I_{CELL0}$ to $I_{CELLn}$ flowing through the memory cells 21 connected to the selection gate SG0_0 of the sector #0, which cause charges to flow out from the bitlines /BL0_0 to /BLn_0. Simultaneously, the voltage levels of the bitlines /BL0_1 to /BLn_1 are decreased due to the reference currents $I_{REF}$ flowing through the reference cells 22 within the sector #1, which causes charges to flow out from the bitlines /BL0_1 to /BLn_1 of the sector #1.

The speeds of the voltage level decreases of the bitlines /BL0_0 to /BLn_0 of the sector #0 depend on the states of the floating gates 36 of the memory cells 21 connected to the selection gate SG0_0. When the floating gate 36 of a selected memory cell 21 is in the "erased" state, the voltage level of the associated bitline BLi_0 relatively rapidly decreases down to the ground level Vss. When the floating gate 36 of a selected memory cell 21 is in the "programmed" state, on the other hand, the voltage level of the associated bitlines /BLi_0 relatively slowly decreases down to the ground level Vss.

On the other hand, the speeds of the voltage level decreases of the bitlines /BL0_1 to /BLn_1 of the sector #1 are dependent on the voltage level α of the bitlines BL0_1 to BLn_1 of the sector #1. The control of the voltage level α of the bitlines BL0_1 to BLn_1 allows adjusting the speeds of the voltage level decreases of the bitlines /BL0_1 to /BLn_1 of the sector #1 to an intermediate speed between that of the bitlines /BL0_0 to /BLn_1 for the floating gates 36 of the memory cells 21 being placed into the "erased" state and that of the bitlines /BL0_0 to /BLn_1 for the floating gates 36 being placed into the "programmed" state.

The sense amplifier 16 is then activated at a proper timing to compare the voltage levels of the bitlines /BL0_0 to /BLn_0 of the sector #0 with the voltage levels of the bitlines /BL0_1 to /BLn_1 of the sector #1, respectively, thereby identifying the data stored in the floating gates 36 in the respective memory cells 21 connected to the selection gate SG0_0. In principle, the timing when the sense amplifier 16 is activated is allow to be delayed until the voltage levels of bitlines connected to memory cells 21 with a "programmed" floating gate 36 are decreased down to the voltage level α.

This is followed by pulling down the selection gates SG0_0 and RSG_1 to the ground level Vss, and pulling down the control gates MG0_0 to MG0_1 to the voltage level $V_{CL}$. Furthermore, the column switches $42_0$ to $42_n$ are turned off, and the discharging switches 83 and 84 are turned on, and the connection switches 25 are turned off. This results in that the state of the memory device is returned to that before the read operation, completing the preparation for the next read operation.

Figure 9B:
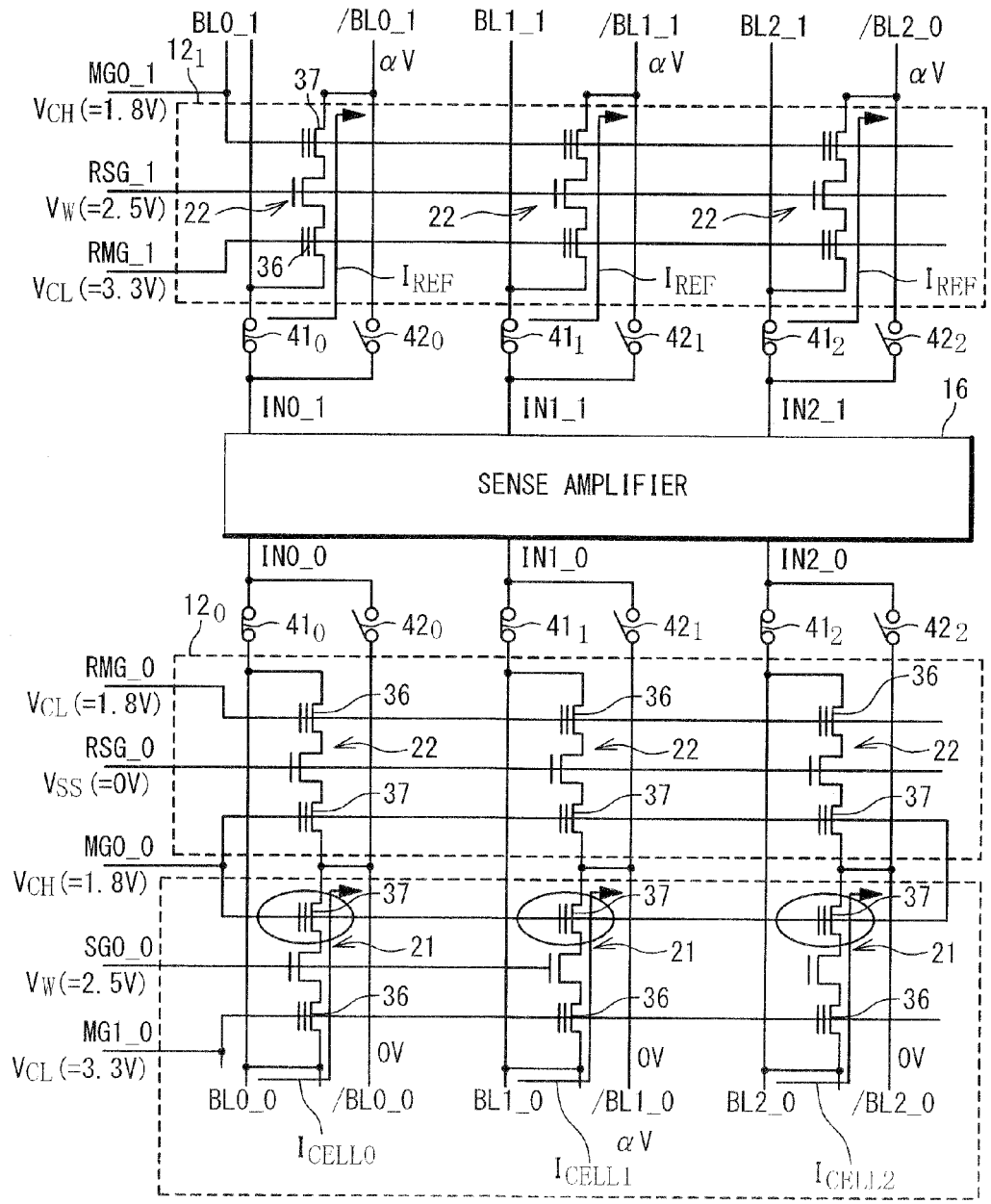

In the read operation from the floating gates 37 of the memory cells 21 connected to the selection gate SG0_0, on the other hand, the cell currents $I_{CELL0}$ to $I_{CELLn}$ and the reference current $I_{REF}$ flow through the memory cells 21 and the reference cells 22, respectively, in the opposite direction as shown in FIG. 9B. It should be noted that the floating gates 37 of the memory cells 21 connected to the selection gate SG0_0 are floating gates positioned near the bitlines /BL0_0 to /BLn_0. The read operation from the floating gates 37 of the memory cells 21 connected to the selection gate SG0_0 of the sector #0 involves comparing the voltage levels of the bitlines BL0_0 to BLn_0 of the sector #0 with those of the bitlines BL0_1 to BLn_1 of the sector #1, respectively.

In detail, the discharging switches 83 in the discharging circuit 18_0 of the sector #0 and the discharging switches 83 and 84 in the discharging circuit 18_1 of the sector #1 are first turned off. The precharge switches 51 of the precharge circuits 15_0, 15_1 are then turned on, while the connection switches 26 of the connection switch circuit 19_1 are turned on. Also, the connection switches 26 of the connection switch circuit 19_1 are turned on. As a result, the bitlines BL0_0 to BLn_0 of the sector #0 and the BL0_1 to BLn_1 of the sector #1 are precharged to the precharge level $V_{PRE}$, while the bitlines /BL0_1 to /BLn_1 of the sector #1 are set to the voltage level α. When the precharge is completed, the precharging switches 51 are turned off.

As shown in FIG. 9B, this is followed by pulling up the selection gate SG0_0 to the positive voltage level $V_W$ in the sector #0, and pulling up the selection gate RSG_1 to the positive voltage level $V_W$ in the sector #1. As a result, the memory cells 21 connected to the selection gate RSG_0 is selected in the sector #0, and the reference cells 22 are selected in the sector #1. The voltage level $V_W$ of the selection gates SG0_0 and RSG_1 is controlled so that the selection transistors within the associated with the memory cells 21 and reference cells 22. The voltage level $V_W$ is, for example, 2.5 V.

Furthermore, the control gate MG1_0, which is associated with the floating gates 36 of the memory cells 21 associated with the selection gate SG0_0, is pulled up to the voltage level $V_H$, which is higher than the voltage level $V_W$, while the control gate RMG_1, which is associated with the floating gates 36 of the reference cells 22 of the sector #1, is pulled up to the voltage level $V_{CH}$.

In addition, the column switches $41_0$ to $41_n$ are turned on in both of the sectors #0 and #1. This allows connecting the bitlines BL0_0 to BLn_0 to the inputs IN0_0 to INn_0 of the sense amplifier 16 in the sector #0, and also connecting the bitlines BL0_1 to BLn_1 to the inputs IN0_1 to INn_1 of the sense amplifier 16 in the sector #1.

Such operations result in that the voltage levels of the bitlines BL0_0 to BLn_0 and BL0_1 to BLn_1 of the sectors #0 and #1 are gradually decreased towards the ground level Vss from the precharge level $V_{PRE}$, as shown in FIG. 10. The speeds of the voltage level decreases of the bitlines BL0_0 to BLn_0 of the sector #0 are dependent on the states of the floating gates 37 of the memory cells 21 connected to the selection gate SG0_0. When the floating gate 37 of a selected targeted memory cell 21 is in the "erased" state, the voltage level of the associated bitline BLi_0 relatively rapidly decreases down to the ground level Vss. On the other hand, when the floating gate 37 of a selected memory cell 21 is in the "programmed" state, the voltage level of the associated bitline BLi_0 relatively slowly decreases down to the ground level Vss.

On the other hand, the speeds of the voltage level decreases of the bitlines BL0_1 to BLn_1 of the sector #1 are dependent on the voltage level α of the bitlines /BL0_1 to /BLn_1 of the sector #1. The control of the voltage level α of the bitlines /BL0_1 to /BLn_1 allows adjusting the speeds of the voltage level decreases of the bitlines BL0_1 to BLn_1 of the sector #1 to an intermediate speed between that of the bitlines BL0_0 to /BLn_1 for the floating gates 37 of the memory cells 21 being placed into the "erased" state and that of the bitlines BL0_0 to /BLn_1 for the floating gates 37 being placed into the "programmed" state.

The sense amplifier 16 is then activated at a proper timing to compare the voltage levels of the bitlines BL0_0 to BLn_0 of the sector #0 with those of the bitlines BL0_1 to BLn_1 of the sector #1, respectively, thereby identifying the data stored in the floating gates 37 in the respective memory cells 21 connected to the selection gate SG0_0.

This is followed by pulling down the selection gates SG0_0, RSG_1 to the ground level Vss, and pulling down the control gates MG1_0 to RMG_1 to the voltage level $V_{CL}$. Furthermore, the column switches $41_0$ to $41_n$ are turned off and the discharging switches 83 and 84 are turned on. The connection switches 26 are also turned off. This results in that the state of the memory device is returned to that before the read operation, completing the preparation for the next read operation.

As thus described, the non-volatile semiconductor memory device in this embodiment is configured to control the sources of the selected reference cells 22, which are placed in the "erased" state, to a proper voltage level higher than the voltage level of the sources of the selected memory cells 21. Such configuration allows (1) reducing the scale of the read circuitry, (2) simplifying the operation sequence, and (3) easily and finely adjusting the current level of the reference current.

Although this embodiment provides the configuration in which the data stored in the memory cells 21 are identified on the basis of the voltage level difference between the bitlines connected to the reference cells 22 and the bitlines connected to the memory cells 21, the memory device of this embodiment may be configured to compare the cell currents flowing through the memory cells 21 with the reference currents flowing through the reference cells 22, thereby identifying the data stored in the memory cells 21, as is the case of the first embodiment. Such modified configuration also allows (1) reducing the scale of the read circuitry, (2) simplifying the operation sequence, and (3) easily and finely adjusting the current level of the reference current.

It is apparent that the present invention is not limited to the above embodiments, but may be modified and changed without departing from the scope of the invention. For example, it should be noted that, although the above-mentioned embodiments provide a "virtual ground" flash memory with "twin-MONOS" memory cells, the non-volatile semiconductor memory device of the present invention is not limited to flash memories having such configuration. The present invention may be generally applied to non-volatile semiconductor memory devices with memory cells and reference cells designed to accumulate charges in floating gates, which are configured to allow individually controlling the voltage levels of the sources of the memory cells and the reference cells.

What is claimed is:

1. A non-volatile semiconductor memory device comprising:
   a first memory cell including a floating gate transistor;
   a first bitline connected to a diffusion layer which is used as a source of said first memory cell;
   a second bitline connected to a diffusion layer which is used as a drain of said first memory cell;
   a first reference cell including a floating gate transistor;
   a third bitline electrically isolated from said first bitline and connected to a diffusion layer which is used as a source of said first reference cell;
   a fourth bitline connected to a diffusion layer which is used as a drain of said first reference cell;
   a read circuit identifying data stored in said first memory cell in response to a memory cell signal received from said first memory cell through said second bitline and a reference signal received from said first reference cell through said fourth bitline; and
   a bitline level controller controlling a voltage level of said third bitline,
   wherein said bitline level controller controls said third bitline to a voltage level different from that of said first bitline in a data read operation from said first memory cell.

2. The non-volatile semiconductor memory device according to claim 1, wherein said first reference cell is placed into an erased state, and
   wherein said bitline level controller controls said third bitline to a voltage level higher than that of said first bitline.

3. The non-volatile semiconductor memory device according to claim 2, wherein said first memory cell and said first reference cell are erased at the same time in an erasing operation, and said first reference cell is not subjected to a programming operation.

4. The non-volatile semiconductor memory device according to claim 2, wherein said first memory cell and said first reference cell are formed in the same well.

5. The non-volatile semiconductor memory device according to claim 1, wherein said read circuit is configured to receive a cell current from said first memory cell and a reference current from said first reference cell and to identify said data stored in said first memory cell by comparing said cell current with said reference current.

6. The non-volatile semiconductor memory device according to claim 1, further comprising:
   a second memory cell including a floating gate transistor; and
   a second reference cell including a floating gate transistor,
   wherein said first bitline is connected to a diffusion layer which is used as a source of said second reference cell,
   wherein said second bitline is connected to a diffusion layer which is used as a drain of said second reference cell,
   wherein said third bitline is connected to a diffusion layer which is used as a source of said second memory cell,
   wherein said fourth bitline is connected to a diffusion layer which is used as a drain of said second memory cell,
   wherein said read circuit identifies data stored in said second memory cell in response to a memory cell signal received from said second memory cell through said fourth bitline and a reference signal received from said second reference cell through said second bitline, and
   wherein said bitline level controller controls said first bitline to a voltage level different from that of said third bitline in a data read operation from said second memory cell.

7. A method of operating a non-volatile semiconductor memory device comprising:
   setting a source of a memory cell including a floating gate transistor to a first voltage level;
   setting a source of a reference cell including a floating gate transistor to a second voltage level; and
   identifying data stored in said memory cell in response to a memory cell signal and a reference signal, said memory cell signal being obtained from said memory cell with said source of said memory cell set to said first voltage level and said reference signal being obtained from said reference cell with said source of said reference cell to set to said second voltage level,
   wherein said first voltage level is different from said second voltage level.

8. The method according to claim 7, wherein said reference cell is placed in an erased state, and
   wherein said second voltage level is higher than said first voltage level.

9. The method according to claim 8, further comprising:
   erasing said memory cell and said reference cell at the same time by setting said sources of said memory cell and said reference cells to the same voltage level.

* * * * *